United States Patent
Chang et al.

(10) Patent No.: US 9,281,475 B2
(45) Date of Patent: Mar. 8, 2016

(54) RESISTIVE RANDOM-ACCESS MEMORY (RRAM) WITH MULTI-LAYER DEVICE STRUCTURE

(71) Applicant: Taiwan Semiconductor Manufacturing Company Limited, Hsinchu (TW)

(72) Inventors: Ting-Chang Chang, Kaohsiung (TW); Kuan-Chang Chang, Kaohsiung (TW); Tsung-Ming Tsai, Kaohsiung (TW); Chih-Hung Pan, Taichung (TW); Ying-Lang Wang, Tai-Chung (TW); Kei-Wei Chen, Tainan (TW); Shih-Chieh Chang, Taipei (TW); Te-Ming Kung, Taichung (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/288,657

(22) Filed: May 28, 2014

(65) Prior Publication Data
US 2015/0349250 A1    Dec. 3, 2015

(51) Int. Cl.
*H01L 45/00* (2006.01)

(52) U.S. Cl.
CPC ............ *H01L 45/1233* (2013.01); *H01L 45/08* (2013.01); *H01L 45/145* (2013.01); *H01L 45/146* (2013.01); *H01L 45/1608* (2013.01)

(58) Field of Classification Search
CPC combination set(s) only.
See application file for complete search history.

(56) References Cited

U.S. PATENT DOCUMENTS

| | | | | |
|---|---|---|---|---|
| 2013/0334485 A1* | 12/2013 | Yang | ................... | H01L 27/0688 257/2 |
| 2014/0117303 A1* | 5/2014 | Wang | ................... | H01L 45/145 257/4 |

* cited by examiner

*Primary Examiner* — Matthew Reames
(74) *Attorney, Agent, or Firm* — Jones Day

(57) ABSTRACT

A resistive memory cell is disclosed. The resistive memory cell comprises a pair of electrodes and a multi-layer resistance-switching network disposed between the pair of electrodes. The multi-layer resistance-switching network comprises a pair of carbon doping layers and a group-IV element doping layer disposed between the pair of carbon doping layers. Each carbon doping layer comprises silicon oxide doped with carbon. The group-IV doping layer comprises silicon oxide doped with a group-IV element. A method of fabricating a resistive memory cell is also disclosed. The method comprises forming a first carbon doping layer on a first electrode using sputtering, forming a group-IV element doping layer on the first carbon doping layer using sputtering, forming a second carbon doping layer on the group-IV element doping layer using sputtering, and forming a second electrode on the second carbon doping layer using sputtering.

20 Claims, 4 Drawing Sheets

RESISTIVE RANDOM-ACCESS MEMORY (RRAM) WITH MULTI-LAYER DEVICE STRUCTURE

BACKGROUND

The technology described in this patent document relates to resistive random access memory (RRAM), and more specifically to the resistive oxide-based layer in RRAM devices.

Resistive random access memory (RRAM) is a type of non-volatile memory having a memory cell that consists of a resistive oxide-based layer sandwiched between two electrodes. RRAM is a candidate for next generation non-volatile memory because of its low cost, simple structure, fast operation speed, low operation power, and non-destructive readout properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
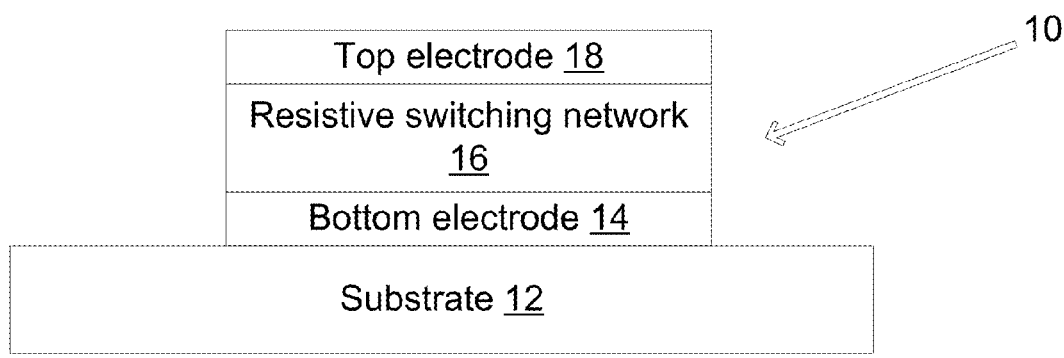
FIG. 1 depicts a cross-sectional view of an example RRAM cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistive random access memory (RRAM) is a type of non-volatile memory having a memory cell that consists of a resistive oxide-based layer sandwiched between two electrodes. FIG. 1 depicts a cross-sectional view of an example RRAM cell. An RRAM cell 10 is formed on a substrate 12. The RRAM cell 10 includes a lower electrode 14, which is a first electrode or a bottom electrode, a resistive switching network 16, and an upper electrode 18, which is a second electrode or a top electrode.

The RRAM cell 10 may have two or more states with different electric resistance values. Each state may represent a different digital value. The RRAM cell 10 may switch from one state to another by applying a predetermined voltage or current to the RRAM cell 10. For example, the RRAM cell 10 has a state of relatively high resistance, referred to as "a high resistance state", and a state of relatively low resistance, referred to as "a low resistance state". The RRAM cell 10 may be switched from the high resistance state to the low resistance state or from the low resistance state to high resistance state by applying a predetermined voltage or current.

The substrate 12 may be a substrate employed in a semiconductor process, such as a silicon substrate. The substrate 12 may comprise a complementary metal oxide semiconductor (CMOS) circuit, an isolation structure, a diode, or a capacitor.

A bottom electrode 14 may be formed on the substrate 12. The bottom electrode 14 can be electrically connected to a terminal of a transistor (not shown) or some other semiconductor device fabricated on the substrate 12. The bottom electrode 14 may be made of gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the bottom electrode 14 may be between a range of about 5-500 nm.

A resistive switching network 16 may be formed on the bottom electrode 14 and contacts with the bottom electrode 14. The material for the resistive switching network may comprise a composite of metal, Si, and O. The thickness of the resistive switching network 16 may be between a range about 1-100 nm. The metal in the resistive switching network may comprise W, Ta, Ti, Ni, Co, Hf, Ru, Zr, Zn, Fe, Sn, Al, Cu, Ag, Mo, Cr, or combinations thereof.

A top electrode 18 may be formed on the resistive switching network 16. The top electrode 18 may be formed from materials such as gold (Au), platinum (Pt), ruthenium (Ru), iridium (Ir), titanium (Ti), aluminum (Al), copper (Cu), tantalum (Ta), tungsten (W), iridium-tantalum alloy (Ir—Ta) or indium-tin oxide (ITO), or any alloy, oxide, nitride, fluoride, carbide, boride or silicide of these, such as TaN, TiN, TiAlN, TiW, or combinations thereof. The thickness of the top electrode 18 may be between a range of about 5-500 nm.

Figure 2:
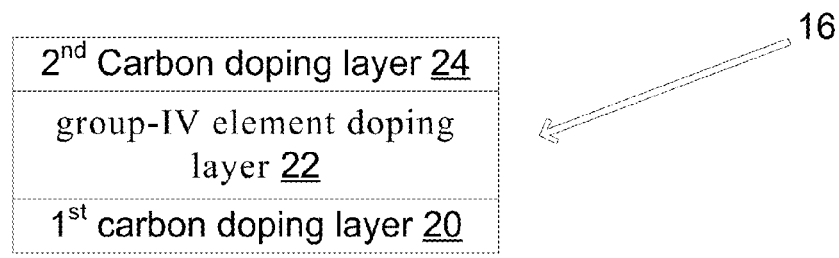
FIG. 2 depicts a cross-sectional view of an example resistive switching network, in accordance with some embodiments.

FIG. 2 depicts a cross-sectional view of an example resistive switching network 16. The example resistive switching network 16 is a multi-layer resistive switching network having more than two layers. In this example, three layers are shown. The example multi-layer resistive switching network comprises a first carbon doping layer 20, a group-IV element doping layer 22, and a second carbon doping layer 24, wherein the group-IV element doping layer 22 is disposed between the first carbon doping layer 20 and the second carbon doping layer 24. Other configurations of layers within the resistive switching network 16 may be used including four or more layers.

The group-IV element doping layer comprises a metal material doped into a dielectric material. The dielectric material in this example comprises silicon oxide or hafnium oxide such as $SiO_2$ or $HfO_2$. The metal material is a group-IV element such as zirconium, titanium, or hafnium. In the example system, zirconium doped into SiOx (referred to as Zr:SiOx) is used in the group-IV element doping layer. The thickness of the group-IV element doping layer is higher than the thickness of either the first carbon doping layer or the second carbon doping layer.

The first carbon doping layer comprises carbon doped into a first dielectric material and the second carbon doping layer comprises carbon doped into a second dielectric material. In this example, the first and second dielectric material comprises silicon oxide or hafnium oxide such as $SiO_2$ or $HfO_2$. The first dielectric material and the second dielectric material may comprise the same elements or different elements. In the example system, carbon doped into SiOx (referred to as C:SiOx) is used in both the first carbon doping layer and the second carbon doping layer. The concentration of carbon in the first carbon doping layer, however, may be different from the concentration of carbon in the second carbon doping layer. Also, the thickness of the first carbon doping layer may be different from the thickness of the second carbon doping layer.

After RRAM cell fabrication, a conduction route is formed, and the resistance state corresponds to the low-resistance state (LRS). The LRS may indicate a logic state of 1. A non-conductor with oxide-base compound is produced by a reverse bias to block the conduction route. The associated resistance state is the high-resistance state (HRS), which may indicate a logic state of 0.

During operation of a RRAM cell, the current should be limited by the system operating the RRAM cell. Without current limiting, breakdown of the RRAM cell may occur. The first carbon doping layer and the second carbon doping layer have current-limiting characteristics, which may render current-limiting by the system unnecessary. The carbon dopants can function to reduce the current. The current reduction may make the use of the RRAM cell in mobile products desirable because of increased endurance and reduced power consumption.

Figure 3:
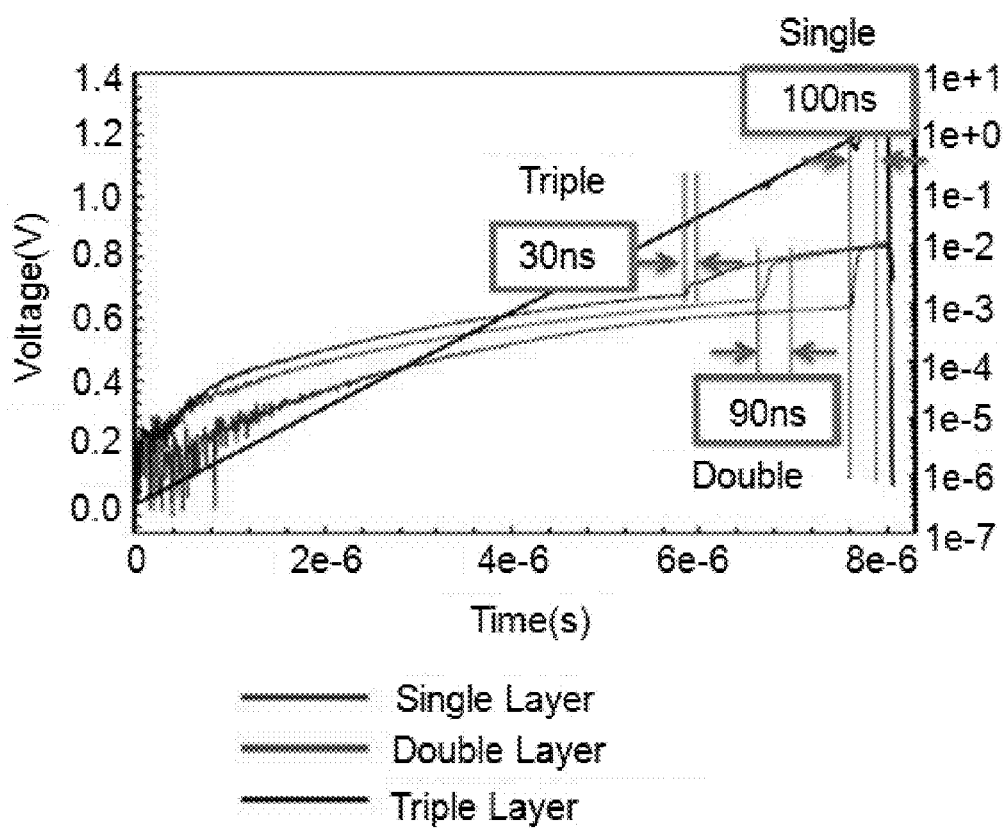
FIG. 3 is a graph illustrating that resistance switching speed of a resistive switching network from one state to another may be increased by the use of carbon dopants in the resistive switching network.

FIG. 3 is a graph illustrating that resistance switching speed of a resistive switching network from one state to another may be increased by the use of carbon dopants in the resistive switching network. As illustrated in the figure, a resistive switching network comprising a single layer of material may have a switching time of 100 ns. A resistive switching network comprising two layers of material (i.e., a carbon doping layer and a group-IV element doping layer) may have a switching time of 90 ns. A resistive switching network comprising three layers of material (i.e., a first carbon doping layer, a group-IV element doping layer, and a second carbon doping layer) may achieve a switching time of 30 ns. The computation speed of the memory cell may be increased by the use of multiple layers in the resistance switching network.

Figure 4:
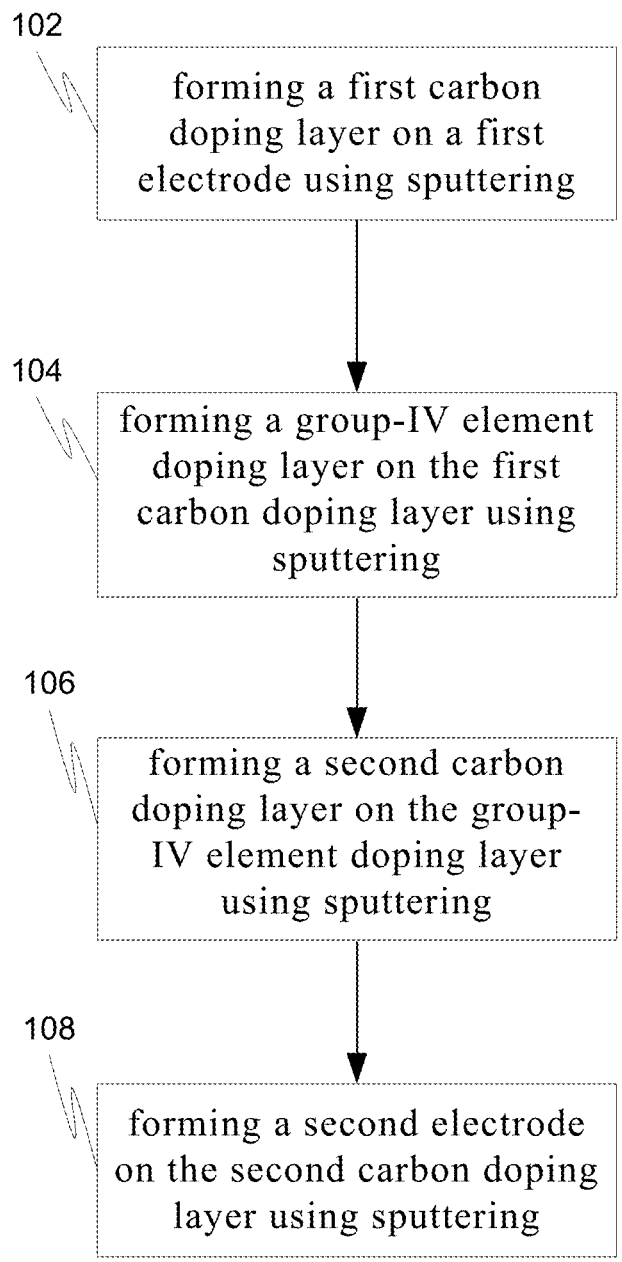
FIG. 4 is a process flow chart depicting an example method of forming a RRAM cell having multiple layers in a resistive switching network, in accordance with some embodiments.

FIG. 4 is a process flow chart depicting an example method of forming a RRAM cell having multiple layers in a resistive switching network. A first carbon doping layer may be formed on a first electrode (which in turn is on a substrate) using sputtering (operation 102). A group-IV element doping layer may be formed on the first carbon doping layer using sputtering (operation 104). A second carbon doping layer may be formed on the group-IV element doping layer using sputtering (operation 106). Finally, a second electrode may be formed on the second carbon doping layer using sputtering (operation 108).

Figure 5:
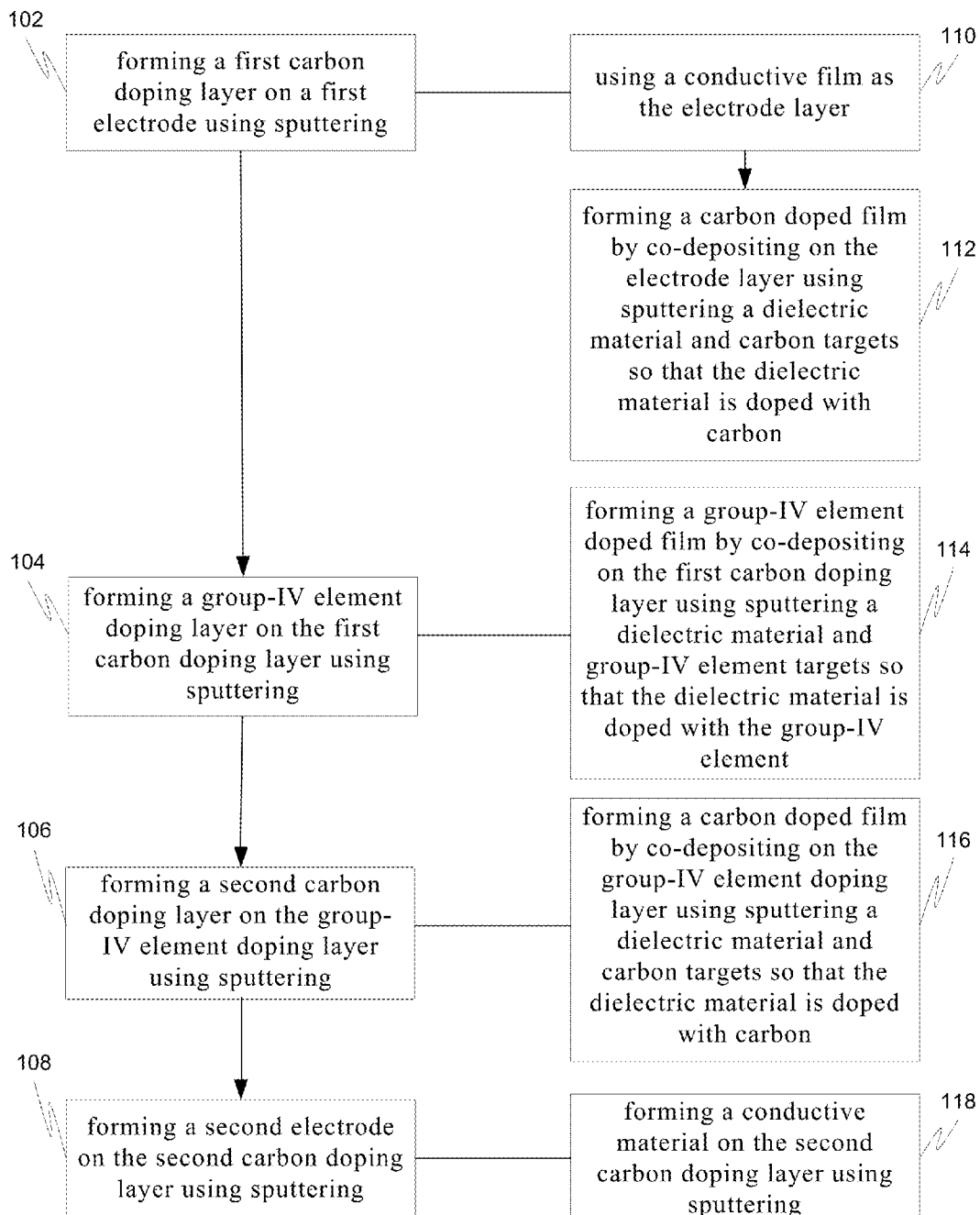
FIG. 5 is a process flow chart depicting another example method of forming a RRAM cell having multiple layers in a resistive switching network.

FIG. 5 is a process flow chart depicting another example method of forming a RRAM cell having multiple layers in a resistive switching network. The method of FIG. 5 is similar to that of FIG. 4 but provides additional operations that may occur in forming a RRAM cell. Forming a first carbon doping layer on a first electrode using sputtering (operation 102) may involve using a conductive film as the electrode layer (operation 110), and forming a carbon doped film by co-depositing on the electrode layer using sputtering a dielectric material and carbon targets so that the dielectric material is doped with carbon (operation 112). In this example, the conductive film may be a titanium nitride film and the dielectric material may comprise silicon oxide or hafnium oxide.

Forming a group-IV element doping layer on the first carbon doping layer using sputtering (operation 104) may involve forming a group-IV element doped film by co-depositing on the first carbon doping layer using sputtering a dielectric material and group-IV element targets so that the dielectric material is doped with the group-IV element (operation 114). In this example, the group-IV element may comprise zirconium, titanium, or hafnium and the dielectric material may comprise silicon oxide or hafnium oxide.

Forming a second carbon doping layer on the group-IV element doping layer using sputtering (operation 106) may comprise forming a carbon doped film by co-depositing on the group-IV element doping layer using sputtering a dielectric material and carbon targets so that the dielectric material is doped with carbon (operation 116). In this example, the dielectric material comprises silicon oxide or hafnium oxide.

Forming a second electrode on the second carbon doping layer using sputtering may comprise (operation 108) forming a conductive material on the second carbon doping layer using sputtering (operation 118). In this example, the conductive material is platinum.

The example structures and methods disclosed herein may result in a RRAM cell with low leakage and high speed turn on/off due to the multi-layer structure of the resistive switching network. The example structures and methods disclosed herein may also result in lower power consumption and a RRAM cell that is self-current limiting.

In one embodiment, disclosed is a resistive memory comprising a first electrode and a second electrode and a multi-layer resistance-switching network disposed between the first electrode and the second electrode. The multi-layer resistance-switching network comprises a group-IV element doping layer, a first carbon doping layer disposed between the group-IV element doping layer and the first electrode, and a second carbon doping layer disposed between the group-IV element doping layer and the second electrode.

These aspects and other embodiments may include one or more of the following features. The group-IV element doping layer may comprise a metal material doped into a dielectric material. The dielectric material may comprise silicon oxide or hafnium oxide. The metal material may comprise zirconium, titanium, or hafnium. The first carbon doping layer may comprise carbon doped into a first dielectric material and the second carbon doping layer may comprise carbon doped into a second dielectric material. The first and second dielectric material may each comprise silicon oxide or hafnium oxide. The first dielectric material and the second dielectric material may comprise the same elements. The concentration of carbon in the first carbon doping layer may be different from the concentration of carbon in the second carbon doping layer.

The thickness of the first carbon doping layer may be different from the thickness of the second carbon doping layer. The thickness of the group-IV element doping layer may be higher than the thickness of either the first carbon doping layer or the second carbon doping layer.

In another embodiment, a method of fabricating a resistive memory is disclosed. The method comprises forming a first carbon doping layer on a first electrode using sputtering, forming a group-IV element doping layer on the first carbon doping layer using sputtering, forming a second carbon doping layer on the group-IV element doping layer using sputtering, and forming a second electrode on the second carbon doping layer using sputtering.

These aspects and other embodiments may include one or more of the following features. Forming a first carbon doping layer on a first electrode using sputtering may comprise using a conductive film as the electrode layer and forming a carbon doped film by co-depositing on the electrode layer using sputtering a dielectric material and carbon targets so that the dielectric material is doped with carbon. Forming a group-IV element doping layer on the first carbon doping layer using sputtering may comprise forming a group-IV element doped film by co-depositing on the first carbon doping layer using sputtering a dielectric material and group-IV element targets so that the dielectric material is doped with the group-IV element. Forming a second carbon doping layer on the group-IV element doping layer using sputtering may comprise forming a carbon doped film by co-depositing on the group-IV element doping layer using sputtering a dielectric material and carbon targets so that the dielectric material is doped with carbon. The conductive film of the first electrode may be a titanium nitride film. The dielectric material may comprise silicon oxide or hafnium oxide. The group-IV element may comprise zirconium, titanium, or hafnium.

In another embodiment, a resistive memory cell is disclosed. The resistive memory cell comprises a pair of electrodes and a multi-layer resistance-switching network disposed between the pair of electrodes. The multi-layer resistance-switching network comprises a pair of carbon doping layers and a group-IV element doping layer disposed between the pair of carbon doping layers. Each carbon doping layer comprises silicon oxide doped with carbon. The group-IV doping layer comprises silicon oxide doped with a group-IV element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A resistive memory comprising:
   a first electrode and a second electrode; and
   a multi-layer resistance-switching network disposed between the first electrode and the second electrode, the multi-layer resistance-switching network comprising:
   a group-IV element doping layer;
   a first carbon doping layer disposed between the group-IV element doping layer and the first electrode; and
   a second carbon doping layer disposed between the group-IV element doping layer and the second electrode.

2. The memory of claim 1, wherein the group-IV element doping layer comprises a metal material doped into a dielectric material.

3. The memory of claim 2 wherein the dielectric material comprises silicon oxide or hafnium oxide.

4. The memory of claim 2 wherein the metal material comprises zirconium, titanium, or hafnium.

5. The memory of claim 1, wherein the first carbon doping layer comprises carbon doped into a first dielectric material and the second carbon doping layer comprises carbon doped into a second dielectric material.

6. The memory of claim 5 wherein each of the first and second dielectric material comprises silicon oxide or hafnium oxide.

7. The memory of claim 5 wherein the first dielectric material and the second dielectric material comprise the same elements.

8. The memory of claim 1, wherein the concentration of carbon in the first carbon doping layer is different from the concentration of carbon in the second carbon doping layer.

9. The memory of claim 1, wherein the thickness of the first carbon doping layer is different from the thickness of the second carbon doping layer.

10. The memory of claim 1, wherein the thickness of the group-IV element doping layer is higher than the thickness of either the first carbon doping layer or the second carbon doping layer.

11. A resistive memory cell comprising:
    a pair of electrodes; and
    a multi-layer resistance-switching network disposed between the pair of electrodes, the multi-layer resistance-switching network comprising:
    a pair of carbon doping layers, each carbon doping layer comprising silicon oxide doped with carbon; and
    a group-IV element doping layer disposed between the pair of carbon doping layers, the group-IV doping layer comprising silicon oxide doped with a group-IV element.

12. A resistive memory comprising:
    a first electrode and a second electrode; and
    a multi-layer resistance-switching network disposed between the first electrode and the second electrode, the multi-layer resistance-switching network comprising:
    a group-IV element doping layer;
    a first carbon doping layer disposed between the group-IV element doping layer and the first electrode; and
    a second carbon doping layer disposed between the group-IV element doping layer and the second electrode,
    wherein the first carbon doping layer comprises carbon doped into a first dielectric material and the second carbon doping layer comprises carbon doped into a second dielectric material.

13. The memory of claim 12, wherein the group-IV element doping layer comprises a metal material doped into a dielectric material.

14. The memory of claim 13, wherein the dielectric material comprises silicon oxide or hafnium oxide.

15. The memory of claim 13, wherein the metal material comprises zirconium, titanium, or hafnium.

16. The memory of claim 12, wherein each of the first and second dielectric material comprises silicon oxide or hafnium oxide.

17. The memory of claim 12, wherein the first dielectric material and the second dielectric material comprise the same elements.

18. The memory of claim 12, wherein the concentration of carbon in the first carbon doping layer is different from the concentration of carbon in the second carbon doping layer.

19. The memory of claim 12, wherein the thickness of the first carbon doping layer is different from the thickness of the second carbon doping layer.

20. The memory of claim 12, wherein the thickness of the group-IV element doping layer is higher than the thickness of either the first carbon doping layer or the second carbon doping layer.

* * * * *